United States Patent
Craft, Jr. et al.

(10) Patent No.: US 6,407,917 B1
(45) Date of Patent: Jun. 18, 2002

(54) FLUID FLOW MANAGEMENT SYSTEM

(75) Inventors: Thomas F. Craft, Jr., Hackettstown; Charles E. Johnson, Randolph, both of NJ (US); Steven J. Smith, Milford, PA (US); Dinh G. Lai, Green Brook, NJ (US); Dianne S. Wolpensinger, Webster, NY (US)

(73) Assignee: Lucent Technologies Inc., Murray Hill, NJ (US)

( * ) Notice: Subject to any disclaimer, the term of this patent is extended or adjusted under 35 U.S.C. 154(b) by 26 days.

(21) Appl. No.: 09/699,746

(22) Filed: Oct. 30, 2000

(51) Int. Cl.[7] ................................................. H05K 7/20
(52) U.S. Cl. ...................... 361/690; 361/703; 165/80.3; 257/722
(58) Field of Search ................................ 361/690–692, 361/691, 703–710, 679, 689, 698–699; 257/706–727; 174/15.1, 16.3; 165/803, 804, 805, 165, 185, 106.33, 104.32, 104.33; 29/832, 837, 840, 845; 62/3.2, 3.3, 3.4, 3.5, 259.2

(56) References Cited

U.S. PATENT DOCUMENTS

| | | | | |
|---|---|---|---|---|
| 5,103,374 A | * | 4/1992 | Azar | 361/382 |
| 5,158,136 A | * | 10/1992 | Azar | 165/185 |
| 5,422,787 A | * | 6/1995 | Courdine | 361/797 |
| 5,514,906 A | * | 5/1996 | Love et al. | 257/712 |
| 5,841,634 A | * | 11/1998 | Visser | 361/699 |
| 5,918,469 A | * | 7/1999 | Cardella | 62/3.7 |
| 5,957,194 A | * | 9/1999 | Azar | 165/80.3 |

FOREIGN PATENT DOCUMENTS

| | | | | |
|---|---|---|---|---|
| JP | 02000138481 A | * | 5/2000 | H05K/7/20 |
| JP | 02001044521 A | * | 2/2001 | H01L/35/30 |

OTHER PUBLICATIONS

IBM Technical Disclosure Bulletine, Nov. 1, 1968, vol. 6, Issue 682.*

* cited by examiner

Primary Examiner—Darren Schuberg
Assistant Examiner—Michael Datskovsky
(74) Attorney, Agent, or Firm—David L. Davis, Esq.

(57) ABSTRACT

A fluid flow management system for enhancing cooling of a circuit pack. The system includes a bar extending transverse to the direction of fluid flow. The bar breaks up the otherwise laminar flow into a turbulent flow.

15 Claims, 5 Drawing Sheets

FLUID FLOW MANAGEMENT SYSTEM

BACKGROUND OF THE INVENTION

This invention relates to an improvement in fluid flow management for heat producing circuit packs of an electronic system.

Modern electronic equipment, such as for telecommunications purposes, is typically constructed with modular circuit packs having electronic components mounted to a circuit board. The circuit packs are installed in racks to make up the overall system. Many of the electronic components generate heat, and it is therefore necessary to remove the heat from the equipment to prevent damaging heat sensitive components. A typical method for cooling electronic equipment is by forcing a fluid, usually air, over the heat generating electronic components. The rate at which heat is removed from those components is based on the heat transfer coefficient, the surface area of the components in contact with the fluid, and the temperature difference between the fluid and the components. A problem with this method of cooling is that the rate at which fluid is moving over the components causes the flow to be laminar. This means that the heat transfer coefficient is low and therefore the cooling of the electronic devices is limited, unless a very expensive and power hungry fan system is employed. This type of system is particularly expensive when only one circuit pack, out of up to twenty in a typical rack, needs the increased amount of fluid flow. Accordingly, a need exists for an inexpensive and efficient way of improving the cooling of a circuit pack.

SUMMARY OF THE INVENTION

According to the present invention, additional fluid flow is not required for enhanced cooling. Instead, the laminar flow is changed into turbulent flow. Thus, according to the present invention, there is provided a fluid flow management system for a circuit pack having electronic components mounted to a circuit board, wherein fluid flow across the circuit pack is in a defined direction. The inventive system comprises a turbulator having mounting members. The mounting members are adapted to secure the turbulator to the circuit board.

In accordance with an aspect of this invention, the turbulator includes an elongated cross bar.

In accordance with another aspect of this invention, the turbulator cross bar has a chamfer on an upstream-facing side to direct the fluid flow toward the circuit board.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
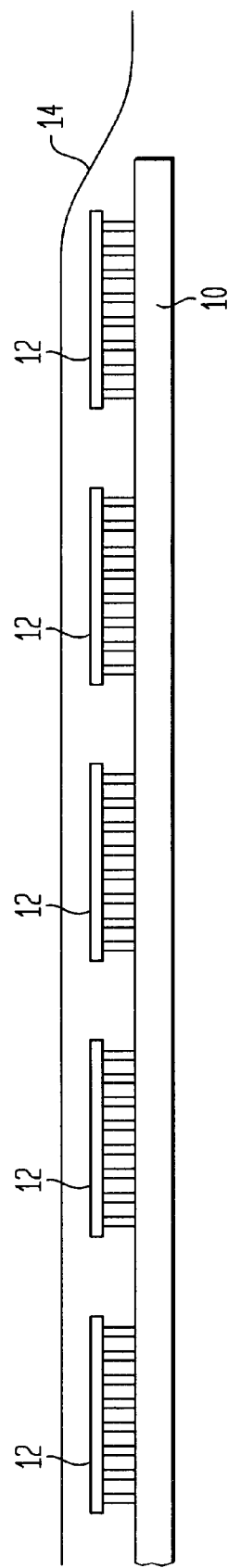
FIG. 1 schematically depicts fluid flow across a circuit board without the inventive system being installed, and shows the boundary layer of the laminar flow.

FIG. 1 illustrates a circuit board 10 with electronic components 12 mounted thereon. The line 14 represents the boundary layer of fluid flowing from right to left over the circuit board 10. Note that the boundary layer 14 is smooth over the electronic components 12. This indicates that the flow between the boundary layer 14 and the circuit board 10 is laminar. As previously discussed, such laminar fluid flow results in a low heat transfer coefficient.

Figure 2:
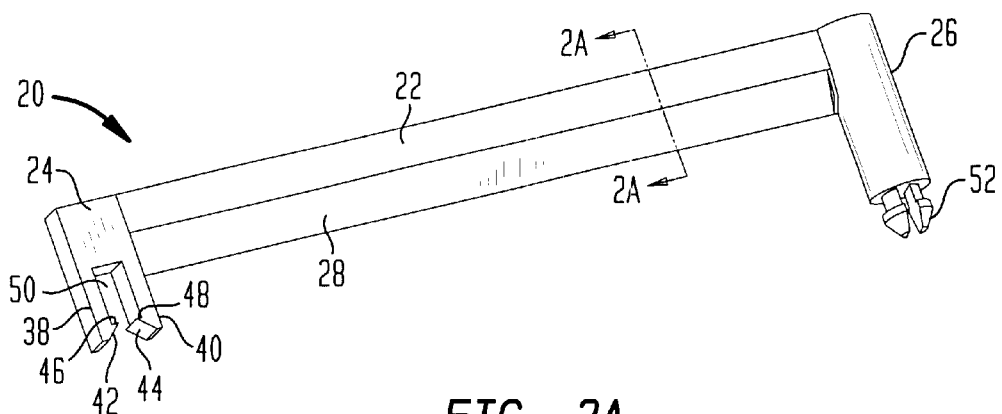
FIG. 2 is a perspective view of a first embodiment of an inventive turbulator.
Figure 2A:
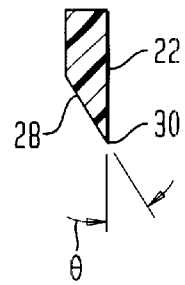
FIG. 2A is a cross sectional view taken along the line 2A—2A in FIG. 2.

FIG. 2 illustrates a first embodiment of an inventive turbulator, designated generally by the reference numeral 20, designed for mounting to the circuit board 10 so as to distrupt the fluid flow boundary layer 14 and create turbulent, rather than laminar, fluid flow which increases the heat transfer coefficient. The turbulator 20 has an elongated cross bar 22 and mounting structure 24, 26 spaced along the bar 22. Illustratively, the turbulator 20 is molded of plastic as a single unitary piece with the mounting structure 24, 26 at opposite ends of the bar 22. The bar 22 has a chamfer 28 on one face extending from approximately the horizontal centerline of that face to the bottom of the lower edge 30. Illustratively, the angle $\theta$ of the chamfer 28 is about 37°.

Figure 3:
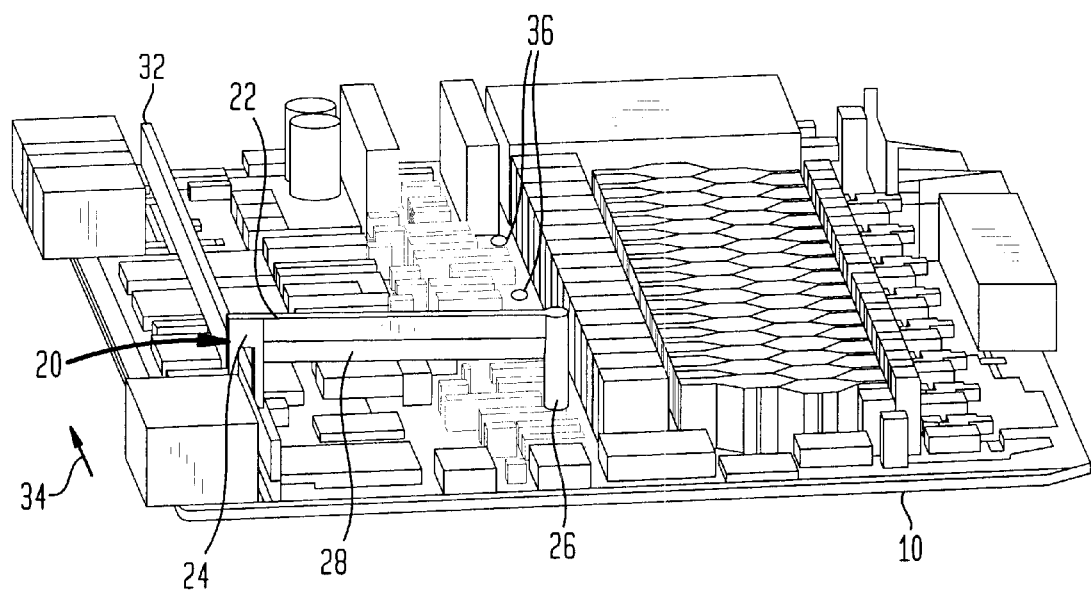
FIG. 3 is a perspective view of a circuit board having the first embodiment of the inventive fluid flow management system installed thereon.

To install the turbulator 20 onto the circuit board 10, as shown in FIG. 3 an elongated rail 32 is mounted to the circuit board 10 parallel to the direction of fluid flow, which is in the direction shown by the arrow 34. Spaced from the rail 32, and across the electronic components which are being cooled, an array of through-holes 36 are formed in the circuit board 10. The through-holes 36 extend along a line which is parallel to the rail 32 and at a distance equal to the length of the turbulator 20. The mounting structure 24 includes a block-like member which is bifurcated to have two depending legs 38, 40. The distal ends of the legs 38, 40 are formed with camming surfaces 42, 44 respectively, terminated by shoulders 46, 48 to leave a central opening 50 complemental to the rail 32. Thus, as the mounting structure 24 is moved downwardly over the rail 32, the legs 38, 40 are spread apart by the action of the camming surfaces 42, 44 and the rail 32 passes into the opening 50. As the shoulders 46, 48 pass the lower edge of the rail 32, the legs 38, 40 move toward each other, capturing the rail 32 within the opening 50 in a snap fit manner. At the other end of the cross bar 22, the mounting structure 26 is formed as a post with a split snap fit feature 52 at its distal end which is adapted for receipt in one of the through-holes 36. Thus, the turbulator 20 can be installed on the circuit board 10 at a selected position along the fluid flow path 34. When the turbulator 20 is so installed, it is oriented so that the chamfer 28 is facing the upstream direction of the fluid flow. This creates a downward vector of the fluid flow toward the circuit board 10.

Figure 4:
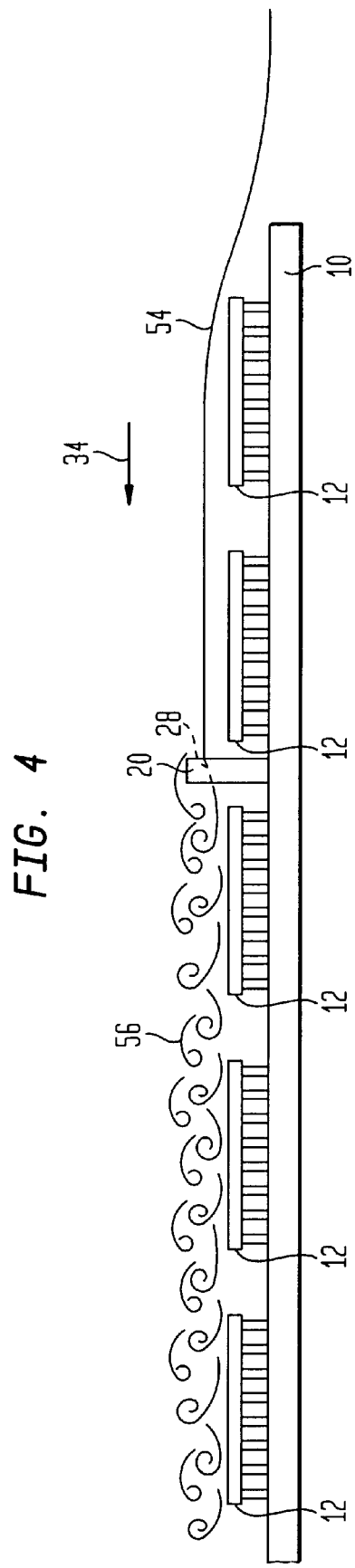
FIG. 4 is a view similar to FIG. 1 showing the fluid flow across a circuit board having the inventive fluid flow management system installed thereon.

FIG. 4 illustrates the fluid flow over the printed circuit board 10 after installation of the turbulator 20. As shown, the line 54 represents the boundary layer of the fluid flow upstream from the turbulator 20 and it is seen to be a laminar flow. However, the turbulator 20 disrupts the laminar flow and causes it to be turbulent downstream from the turbulator 20, as shown by the wave-like design 56. This turbulent flow increases the heat transfer coefficient to enhance the cooling of the electronic components 12 mounted to the circuit board 10.

Figure 5:
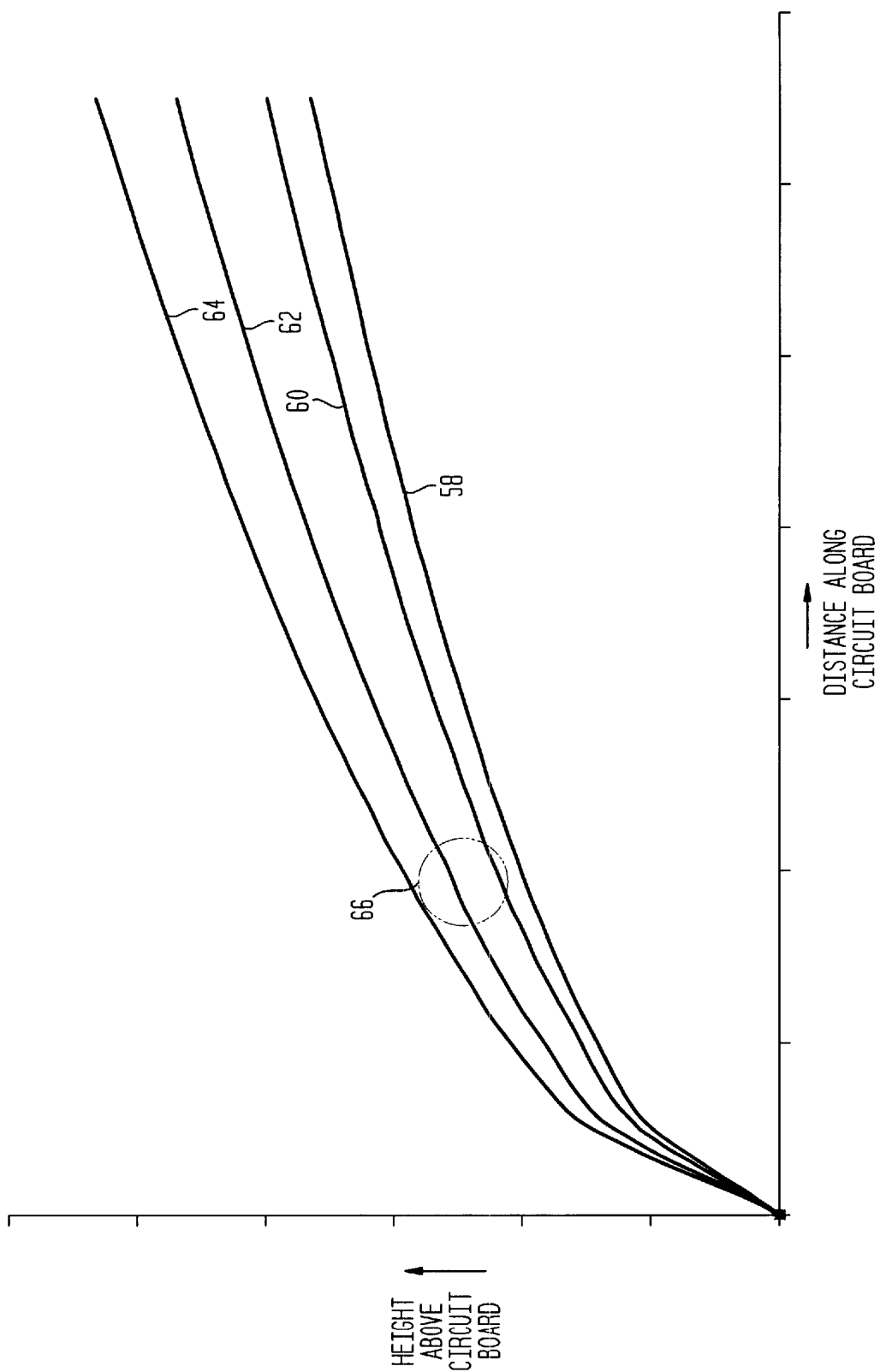
FIG. 5 is a graph showing boundary layer height as a function of fluid flow velocity along a flat plate and is used to illustrate how the turbulator dimensions are selected.
Figure 6:
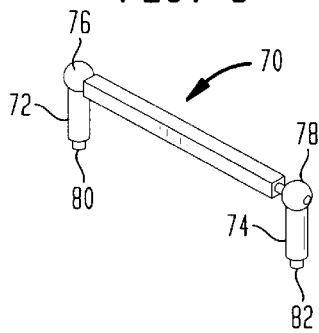
FIG. 6 is a perspective view of a second embodiment of an inventive turbulator.

FIG. 5 is a graph showing boundary layer height as a function of distance along the circuit board 10 for the configuration shown in FIG. 1 without the turbulator 20 being installed. Each of the four curves 58, 60, 62, 64 shows the boundary layer for a different respective fluid flow velocity, with the curve 58 being for the lowest fluid flow velocity and the curve 64 being for the highest fluid flow velocity. The broken circle 66 shows the placement and dimensions for a turbulator which will intersect the boundary layers over the range of fluid flows which can be expected to be encountered.

The aforedescribed turbulator increases the heat transfer coefficient, which lowers the device temperature and thus decreases the effects of one of the factors in component reliability (i.e., high temperature), without requiring additional fluid flow. It should be noted that the inventive turbulator is designed for use where forced convective cooling is in use. A positive aspect of the inventive turbulator is that the flow enhancing device is added on the circuit pack only when required, and its cost is only pennies per circuit pack. This low cost should be compared to the cost of ten dollars to twenty dollars per circuit pack if an additional fluid moving system is employed. (This assumes that all twenty circuit packs in a rack need the additional fluid flow.)

Figure 7:
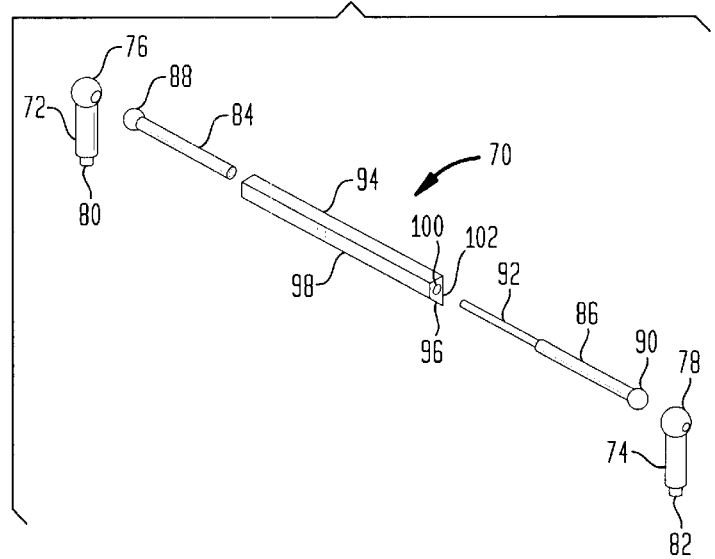
FIG. 7 is an exploded perspective view of the turbulator shown in FIG. 6.

FIGS. 6–13 show a second embodiment of an inventive turbulator, designated generally by the reference numeral 70. As shown in FIG. 7, the turbulator 70 includes a pair of mounting posts 72, 74, each topped by a respective ball socket 76, 78, and each terminated at its lower end by a respective pin 80, 82 adapted for receipt in a through-hole of the circuit board 10. Alternatively, instead of the pins 80, 82, the mounting posts 72, 74 can be terminated by a snap-fit feature similar to the snap-fit feature 52 (FIG. 2) of the turbulator 20.

The turbulator 70 further includes a pair of rods 84, 86 each terminated at one end by a respective ball 88, 90 adapted for receipt in one of the sockets 76, 78. The rod 86 is terminated at its end opposite the ball 88 by a coaxial smaller diameter rod 92 and the rod 84 is hollow so that it can receive therein in a telescoping manner the rod 92, so as to selectively vary the distance between the balls 88, 90. The turbulator 70 also includes a cross bar 94 having a chamfer 96 on a first face 98 and a circular slot 100 on an opposite face 102. The chamfer 96 is similar in design and purpose to the chamfer 28 of the turbulator 20. The slot 100 is dimensioned so that the cross bar 94 can be snap-fit over the rods 84, 86, which are of equal diameter. This arrangement allows the cross bar 94 to be rotated about the longitudinal axis defined by the rods 84, 86. Preferably, the dimensions of the slot 100 and the rods 84, 86 are such that there is frictional engagement between the cross bar 94 and the rods 84, 86 to maintain the cross bar 94 at whatever rotational angle it has assumed.

Figure 8:
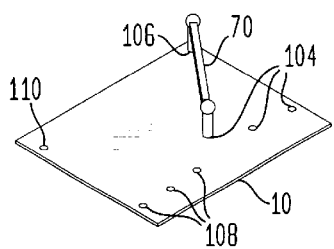
FIGS. 8–13 show various mounting configurations for the turbulator shown in FIG. 6.
Figure 9:
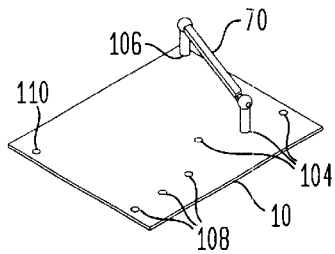
Figure 10:
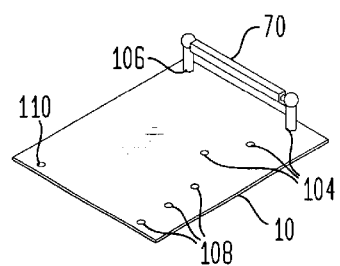
Figure 11:
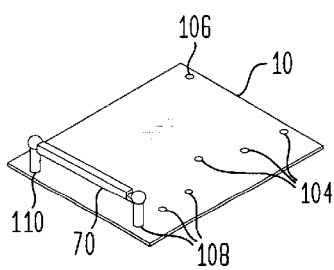
Figure 12:
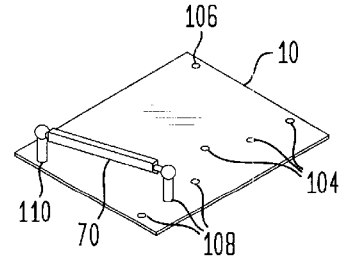
Figure 13:
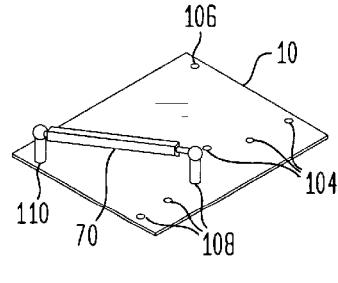

The turbulator 70 is advantageous in that it can be configured for particular fluid flow patterns. As shown in FIGS. 8–13, different patterns of through-holes can be provided in the circuit board 10 so that the turbulator 70 is rotatable about an axis perpendicular to the circuit board 10 to direct the fluid flow to a specific area on the circuit board 10 where a lot of heat is generated. Thus, as shown in FIGS. 8–10, with the through-holes 104 arrayed along a circular arc centered at the through-hole 106, a fixed length turbulator 70 can be rotated about an axis passing through the through-hole 106. As shown in FIGS. 11–13, with the through-holes 108 in a linear array, the turbulator 70 can be rotated about an axis extending through the through-hole 110 by changing the length of the turbulator 70. Further, by increasing the length of the post 112 (FIG. 13), the turbulator 70 can be rotated about an axis parallel to the circuit board 10.

By rotating the cross bar 98 about the longitudinal axis of the rods 84, 86, this changes the angle of the chamfer 96 and such rotation can be utilized to reduce "congestion" in conditions of low fluid flow or situations where there are "tall" electronic components. By having the turbulator 70 of variable length, this can accommodate different widths of the channel through which fluid flow is directed. In the event a longer length turbulator 70 is required, an additional cross bar 94 can be snapped onto the rods 84, 86.

It has also been found that if a plurality of turbulators 20, 70 are mounted to the circuit board 10 in a spaced array along the direction of fluid flow, enhanced cooling is effected.

Accordingly, there has been disclosed an improved fluid flow management system for a circuit pack. While exemplary embodiments of the present invention have been disclosed herein, it will be appreciated that various adaptations and modifications to the disclosed embodiments are possible and it is intended that this invention be limited only by the scope of the appended claims.

What is claimed is:

1. A fluid flow management system for a circuit pack having electronic components mounted to a circuit board and wherein fluid flow across the circuit pack is in a defined direction, the system comprising:

a turbulator having an elongated cross bar and a pair of mounting members spaced along the bar, wherein the mounting members are adapted to secure the turbulator to the circuit board; and an elongated rail secured to the board parallel to the defined direction of fluid flow and wherein one of said pair of mounting members includes a bifurcated member adapted to straddle the rail.

2. The system according to claim 1 wherein the turbulator cross bar has a chamfer on an upstream-facing side to direct the fluid flow toward the circuit board.

3. The system according to claim 2 wherein the chamfer is at an angle of about 37°.

4. The system according to claim 1 wherein the bifurcated member includes a snap-fit feature at its distal end to removably secure the bifurcated member to the rail.

5. A fluid flow management system for a circuit pack having electronic components mounted to a circuit board and wherein fluid flow across the circuit pack is in a defined direction, the system comprising:

a turbulator having an elongated cross bar and a pair of mounting members spaced along the bar, wherein the mounting members are adapted to secure the turbulator to the circuit board; and at least one through-hole in the circuit board and wherein one of said pair of mounting members includes a post adapted for insertion in said at least one through-hole.

6. The system according to claim 5 wherein the post includes a snap-fit feature at its distal end to removably secure the post in the at least one through-hole.

7. The system according to claim 5 wherein said at least one through-hole consists of a single through-hole and further comprising a plurality of second through-holes in the circuit board arrayed along an arc of a circle centered at said single through-hole;

wherein said pair of mounting members includes a first post adapted for insertion in said single through-hole and a second post adapted for insertion in a selected one of said plurality of second through-holes;

whereby the angle of the turbulator cross bar relative to the direction of fluid flow can be varied.

8. A The system according to claim 5 wherein the turbulator cross bar has a chamfer on an upstream-facing side to direct the fluid flow toward the circuit board.

9. The system according to claim 8 wherein the chamfer is at an angle of about 37°.

10. A fluid flow management system for a circuit pack having electronic components mounted to a circuit board and wherein fluid flow across the circuit pack is in a defined direction, the system comprising:

a turbulator having an elongated cross bar and a pair of mounting members spaced along the bar, wherein the mounting members are adapted to secure the turbulator to the circuit board; and a rod extending between said pair of mounting members and having a longitudinal axis, wherein said cross bar is mounted to said rod for rotation about said longitudinal axis.

11. The system according to claim 10 wherein each end of said rod is formed as a ball and each of said pair of mounting members includes a ball socket adapted to receive a respective rod end ball.

12. The system according to claim 10 wherein:

said rod consists of first and second rods each secured to a respective one of said pair of mounting members; and said first and second rods are secured one to the other in a telescoping manner.

13. The system according to claim 12 wherein an end of each of said first and second rods is formed as a ball and each of said pair of mounting members includes a ball socket adapted to receive a respective rod end ball.

14. The system according to claim 10 wherein the turbulator cross bar has a chamfer on an upstream-facing side to direct the fluid flow toward the circuit board.

15. The system according to claim 14 wherein the chamfer is at an angle of about 37°.

\* \* \* \* \*